United States Patent
Song et al.

(10) Patent No.: US 11,502,270 B2
(45) Date of Patent: Nov. 15, 2022

(54) DISPLAY DEVICE

(71) Applicant: Samsung Display Co., LTD., Yongin-si (KR)

(72) Inventors: Kicheol Song, Suwon-si (KR); Young Do Kim, Cheonan-si (KR); Youngmoon Kim, Asan-si (KR); Nari Ahn, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 155 days.

(21) Appl. No.: 17/116,282

(22) Filed: Dec. 9, 2020

(65) Prior Publication Data

US 2021/0184161 A1  Jun. 17, 2021

(30) Foreign Application Priority Data

Dec. 12, 2019 (KR) .................. 10-2019-0165451

(51) Int. Cl.
   *H01L 51/52* (2006.01)
   *H01L 51/00* (2006.01)
   *H01L 27/32* (2006.01)

(52) U.S. Cl.
   CPC ...... *H01L 51/5237* (2013.01); *H01L 51/0097* (2013.01); *H01L 27/3244* (2013.01); *H01L 2251/5338* (2013.01)

(58) Field of Classification Search
   None
   See application file for complete search history.

(56) References Cited

U.S. PATENT DOCUMENTS

| | | |
|---|---|---|
| 6,878,441 B2 | 4/2005 | Kondo et al. |
| 10,240,068 B2 | 3/2019 | Nam et al. |
| 2017/0043566 A1 | 2/2017 | Kanno et al. |
| 2017/0121564 A1 | 5/2017 | Cho et al. |
| 2018/0203321 A1 | 7/2018 | Shin et al. |
| 2018/0291240 A1 | 10/2018 | Behling et al. |
| 2020/0266368 A1 | 8/2020 | Park et al. |
| 2020/0395569 A1 | 12/2020 | Song et al. |

FOREIGN PATENT DOCUMENTS

| | | |
|---|---|---|
| KR | 10-0584026 | 5/2006 |
| KR | 10-1745849 | 6/2017 |
| KR | 10-2017-0097856 | 8/2017 |

(Continued)

*Primary Examiner* — Vip Patel
(74) *Attorney, Agent, or Firm* — H.C. Park & Associates, PLC

(57) ABSTRACT

A display device includes: a display panel; a window disposed on the display panel; a window protection layer disposed on the window; and a first adhesive layer disposed between the window and the window protection layer; wherein the first adhesive layer has a creep value of about 38.1876% to about 40.4371% at a temperature of about 25° C. when a stress of about 2,000 Pa is applied to the first adhesive layer for about 10 minutes, the first adhesive layer has a storage modulus of about 0.0317 MPa to about 0.0348 MPa, a loss modulus of about 0.0108 MPa to about 0.0120 MPa, and a tan delta value of about 0.3354 to about 0.3480 at the temperature of about 25° C. when a frequency of about 1 Hz and an axial force of about 1.0 N are applied and the first adhesive layer maintains a strain of about 1%, and the tan delta value is defined by dividing the loss modulus by the storage modulus.

18 Claims, 9 Drawing Sheets

(56) References Cited

FOREIGN PATENT DOCUMENTS

| KR | 10-2018-0015718 | 2/2018 |
|----|-----------------|--------|
| KR | 10-1854493 | 5/2018 |
| KR | 10-1871551 | 6/2018 |
| KR | 10-2018-0085399 | 7/2018 |
| KR | 10-2019-0069334 | 6/2019 |
| KR | 10-2132112 | 7/2020 |
| KR | 10-2020-0101574 | 8/2020 |
| KR | 10-2020-0143620 | 12/2020 |

DISPLAY DEVICE

CROSS REFERENCE TO RELATED APPLICATION

This application claims priority from and the benefit of Korean Patent Application No. 10-2019-0165451, filed on Dec. 12, 2019, which is hereby incorporated by reference for all purposes as if fully set forth herein.

BACKGROUND

Field

Exemplary implementations of the invention relate generally to a display device, and more specifically to a display device including an adhesive layer.

Discussion of the Background

Electronic equipment, such as smartphones, digital cameras, laptop computers, navigation units, and smart televisions, include a display device to display an image to a user. The display device generates an image to provide the generated image to the user through a display screen.

In recent years, various types of display devices have been developed in conjunction with technology development of the display device. For example, a flexible display device that is foldable and rollable has been developed. The flexible display device that is deformable into various shapes may be portable and thus increase convenience of the user.

The display device may include a display panel, a window disposed on the display panel, and a window protection layer disposed on the window. An adhesive layer may be disposed between the window protection layer and the window to attach the window protection layer to the window.

The above information disclosed in this Background section is only for understanding of the background of the inventive concepts, and, therefore, it may contain information that does not constitute prior art.

SUMMARY

Applicant discovered that when the window protection layer of a display device is pressed and attached to the window, or the display device is repeatedly folded, the adhesive layer may be deformed.

Display devices constructed according to the principles and exemplary implementations of the invention include an adhesive layer having a high elastic property, a low strain, and a high adhesive property.

Additional features of the inventive concepts will be set forth in the description which follows, and in part will be apparent from the description, or may be learned by practice of the inventive concepts.

According to one aspect of the invention, a display device includes: a display panel; a window disposed on the display panel; a window protection layer disposed on the window; and a first adhesive layer disposed between the window and the window protection layer; wherein the first adhesive layer has a creep value of about 38.1876% to about 40.4371% at a temperature of about 25° C. when a stress of about 2,000 Pa is applied to the first adhesive layer for about 10 minutes, the first adhesive layer has a storage modulus of about 0.0317 MPa to about 0.0348 MPa, a loss modulus of about 0.0108 MPa to about 0.0120 MPa, and a tan delta value of about 0.3354 to about 0.3480 at the temperature of about 25° C. when a frequency of about 1 Hz and an axial force of about 1.0 N are applied and the first adhesive layer maintains a strain of about 1%, and the tan delta value is defined by dividing the loss modulus by the storage modulus.

The first adhesive layer may have a storage modulus of about 0.1463 MPa to about 0.1994 MPa, a loss modulus of about 0.1458 MPa to about 0.2071 MPa, and a tan delta value of about 0.9885 to about 1.0519 at a temperature of about −20° C.

The first adhesive layer may have a storage modulus of about 0.0490 MPa to about 0.0629 MPa, a loss modulus of about 0.0229 MPa to about 0.0318 MPa, and a tan delta value of about 0.4673 to about 0.5056 at a temperature of about 2° C.

The first adhesive layer may have a storage modulus of about 0.0181 MPa to about 0.0243 MPa, a loss modulus of about 0.0073 MPa to about 0.0102 MPa, and a tan delta value of about 0.4033 to about 0.4309 at a temperature of about 60° C.

The first adhesive layer may have a storage modulus of about 0.0137 MPa to about 0.0215 MPa, a loss modulus of about 0.0058 MPa to about 0.0095 MPa, and a tan delta value of about 0.4173 to about 0.4455 at a temperature of about 85° C.

The first adhesive layer may have a residual strain of about 7.0426% to about 8.0211% at a temperature of about 25° C. when about 10 minutes elapse after the stress applied to the first adhesive layer is removed.

The first adhesive layer may have a creep value of about 52.3894% to about 59.9129% at a temperature of about 60° C. when stress of about 2,000 Pa is applied to the first adhesive layer for about 10 minutes.

The first adhesive layer may have a residual strain of about 6.3912% to about 8.5546% at a temperature of about 60° C. when about 10 minutes elapse after the stress applied to the first adhesive layer is removed.

The first adhesive layer may have a thickness of about 10 μm to about 50 μm.

The first adhesive layer may have a silicon-based resin, an acrylic-based resin, or an urethane-based resin.

The window protection layer may include at least one polymer resin of a polyethylene terephthalate, a polybutylene terephthalate, a polyethylene naphthalene, a polycarbonate, a polymethylmethacrylate, a polystyrene, a polyvinylchloride, a polyethersulfone, a polypropylene, a polyamide, a modified polyphenylene ether, a polyoxymethylene, a polysulfone, a polyphenylene sulfide, a polyimide, a polyethyleneimine, a polyether ether ketone, a polyamide imide, a polyarylate, and a thermoplastic polyurethane.

The display device may further include: an input sensor disposed on the display panel; an anti-reflection layer disposed between the input sensor and the window; a protection layer disposed below the display panel; a support member disposed below the protection layer; a second adhesive layer disposed between the window and the anti-reflection layer; a third adhesive layer disposed between the anti-reflection layer and the input sensor; a fourth adhesive layer disposed between the display panel and the protection layer; and a fifth adhesive layer disposed between the protection layer and the support member; wherein at least one of the second, third, fourth, and fifth adhesive layers has substantially the same physical properties as the first adhesive layer.

The window may include a glass.

The adhesive force of the first adhesive layer with respect to the window may be about 810±25 gf/in at the temperature of about 25° C., and the adhesive force may be a delamination force value when the window protection layer is attached to the window through the first adhesive layer and delaminated from the window after about 30 minutes elapse.

The adhesive force of the first adhesive layer with respect to the window may be about 256±17 gf/in at the temperature of about 80° C., and the adhesive force may be a delamination force value when the window protection layer is attached to the window through the first adhesive layer and delaminated from the window after about 30 minutes elapse.

The at least one of the display panel and the window protection layer may be in-folded or out-folded with respect to a folding axis.

The input sensor may include an input sensing part and the support member may include a support part.

According to another aspect of the invention, a display device includes: a display panel; a window disposed on the display panel; a window protection layer disposed on the display panel; and an adhesive layer disposed between the window and the window protection layer; wherein an adhesive force of the adhesive layer with respect to the window may be about 810±25 gf/in at a temperature of about 25° C., and an adhesive force of the adhesive layer with respect to the window is about 256±17 gf/in at a temperature of about 80° C.; and the adhesive force is a delamination force value when the window protection layer is attached to the window through the adhesive layer and delaminated from the window after about 30 minutes elapse.

The adhesive layer may have a creep value of about 38.3271% to about 40.4371% at the temperature of about 25° C. when a stress of about 2,000 Pa is applied to the adhesive layer for about 10 minutes, and the adhesive layer may have a storage modulus of about 0.0317 MPa to about 0.0348 MPa and a loss modulus of about 0.0108 MPa to about 0.0120 MPa at the temperature of about 25° C. when a frequency of about 1 Hz and an axial force of about 1.0 N are applied and the adhesive layer may maintain a strain of about 1%.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
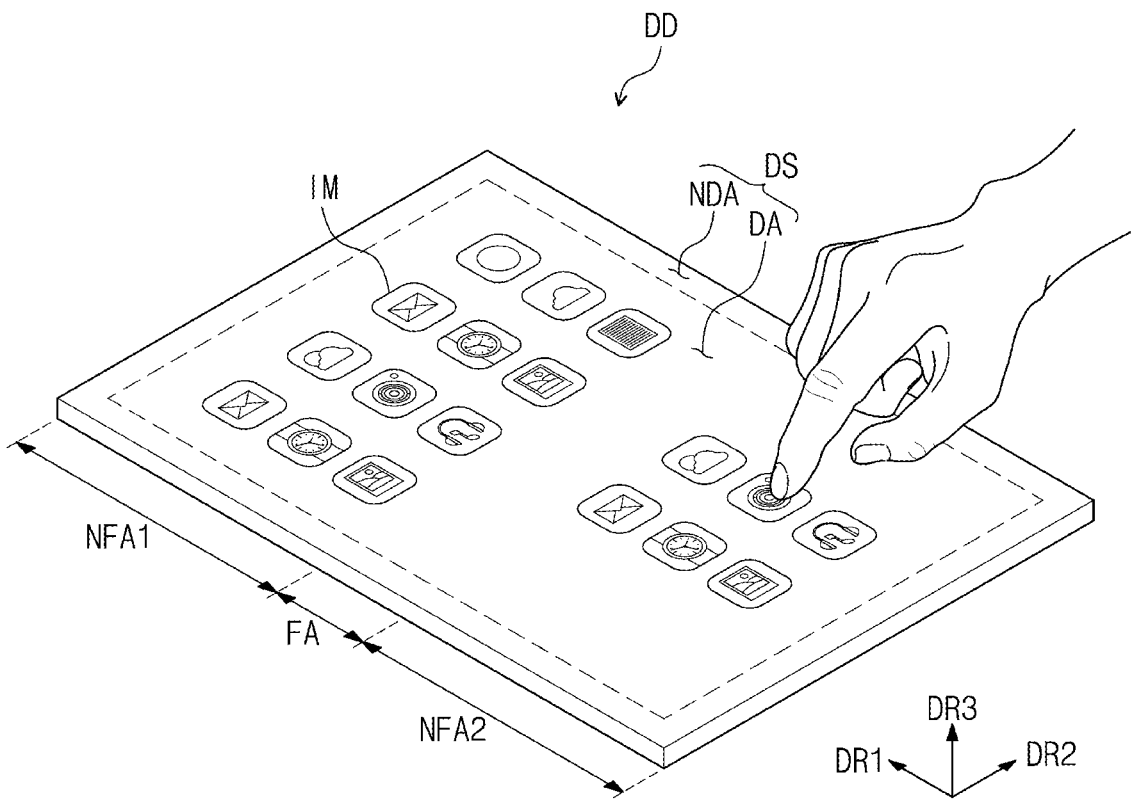
FIG. 1 is a perspective view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, component, region, or portion, is referred to as being "on," "connected to," or "coupled to" another element, layer, component, region, or portion, it may be directly on, connected to, or coupled to the other element, layer, component, region, or portion, or intervening elements, layers, components, regions, or portions may be present. When, however, an element, layer, component, region, or portion is referred to as being "directly on," "directly connected to," or "directly coupled to" another element, layer, component, region, or portion there are no intervening elements, layers, components, regions, or portions present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, properties, fixed numbers, integers, steps, operations, elements, components, and/or groups thereof, but do not preclude the presence or addition of one or more other features, properties, fixed numbers, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
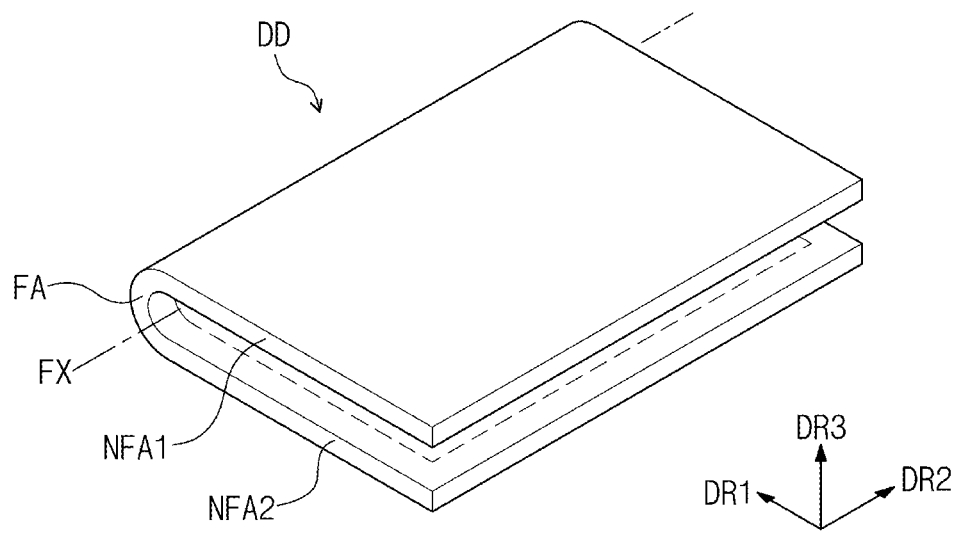
FIG. 2 is a perspective view illustrating a folded position of the display device of FIG. 1.

FIG. 1 is a perspective view illustrating an exemplary embodiment of a display device constructed according to principles of the invention. FIG. 2 is a perspective view illustrating a folded position of the display device of FIG. 1.

Referring to FIG. 1, a display device DD according to an exemplary embodiment may have a generally rectangular shape having long sides in a first direction DR1 and short sides in a second direction DR2 intersecting the first direction DR1. However, the exemplary embodiments are not limited thereto. For example, the display device DD may have various shapes such as a generally circular shape or a generally polygonal shape. The display device DD may be a generally flexible display device.

As discussed herein, a direction that intersects a plane defined by the first and second directions DR1 and DR2 in a substantially perpendicular manner is defined as a third direction DR3.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

Although one folding area FA and two non-folding areas NFA1 and NFA2 are exemplarily illustrated, some exemplary embodiments are not limited to the number of each of the folding area FA and the non-folding areas NFA1 and NFA2. For example, the display device DD may include two or more plurality of non-folding areas and a plurality of folding areas disposed between the two or more plurality of non-folding areas.

A top surface of the display device DD may be defined as a display surface DS and have a plane defined by the first direction DR1 and the second direction DR2. Images IM generated in the display device DD may be provided to a user through the display surface DS.

The display surface DS may include a display area DA and a non-display area NDA around the display area DA. The display area DA may display the images IM, and the non-display area NDA may not display an image. The non-display area NDA may define an edge surrounding the display area DA and printed in a predetermined color.

Referring to FIG. 2, the display device DD may be folded or unfolded. For example, the display device DD may be folded such that the folding area FA is bent with respect to a folding axis FX generally parallel to the second direction DR2. The folding axis FX may be defined as a short axis generally parallel to the short side of the display device DD.

When the display device DD is folded, the first non-folding area NFA1 and the second non-folding area NFA2 may face each other, and the display device DD may be inwardly folded (in-folded) so that the display surface DS is not exposed to the outside.

Figure 3:
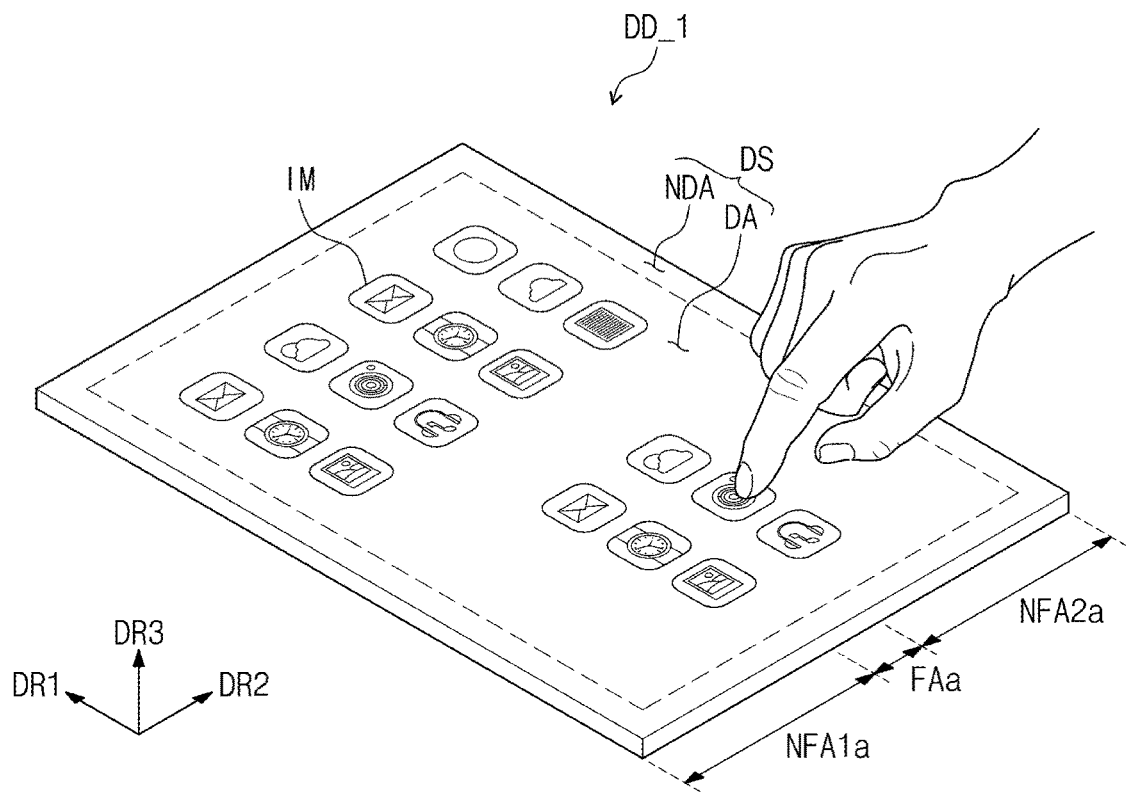
FIG. 3 is a perspective view illustrating another exemplary embodiment of a display device constructed according to principles of the invention.
Figure 4:
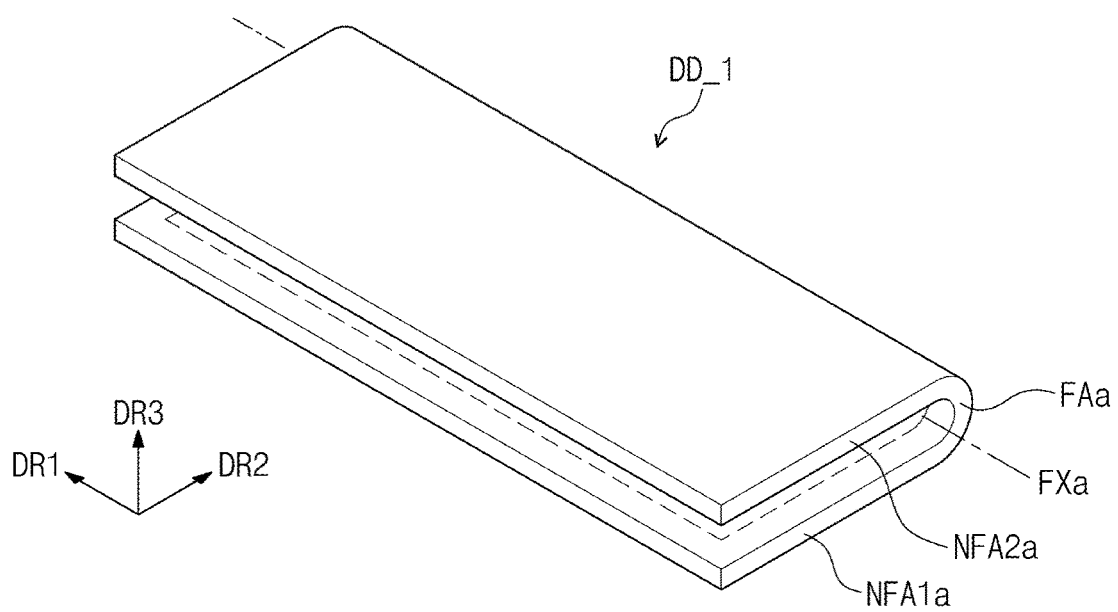
FIG. 4 is a perspective view illustrating a folded position of the display device of FIG. 3.

FIG. 3 is a perspective view illustrating another exemplary embodiment of a display device constructed according to principles of the invention. FIG. 4 is a perspective view illustrating a folded position of the display device of FIG. 3.

A display device DD_1 in FIG. 3 may have substantially the same configuration as the display device DD in FIG. 1 except for the folding operation. Thus, hereinafter, the folding operation of the display device DD_1 will be mainly described, and description of like elements will be omitted to avoid redundancy.

Referring to FIGS. 3 and 4, the display device DD_1 may include a folding area FAa and a plurality of non-folding areas NFA1a and NFA2a. The non-folding areas NFA1a and NFA2a may include a first non-folding area NFA1a and a second non-folding area NFA2a. The folding area FAa may be disposed between the first non-folding area NFA1a and the second non-folding area NFA2a. The folding area FAa, the first non-folding area NFA1a, and the second non-folding area NFA2a may be arranged in the second direction DR2.

The display device DD_1 may be folded such that the folding area FAa is bent with respect to a folding axis FXa generally parallel to the first direction DR1. The folding axis FXa may be defined as a long axis generally parallel to the long side of the display device DD_1. The display device DD in FIG. 1 may be folded with respect to the short side, and, unlike to this, the display device DD_1 in FIG. 3 may be folded with respect to the long side. The display device DD_1 may be in-folded so that the display surface DS is not exposed to the outside.

Although the display devices DD and DD_1, which are in-folded with respect to the folding axes FX and FXa, are exemplarily described, the exemplary embodiments are not limited to the folding operations of the display devices DD and DD_1. For example, each of the display devices DD and DD_1 may be outwardly folded (out-folded) so that the display surface DS is exposed to the outside.

Figure 5:
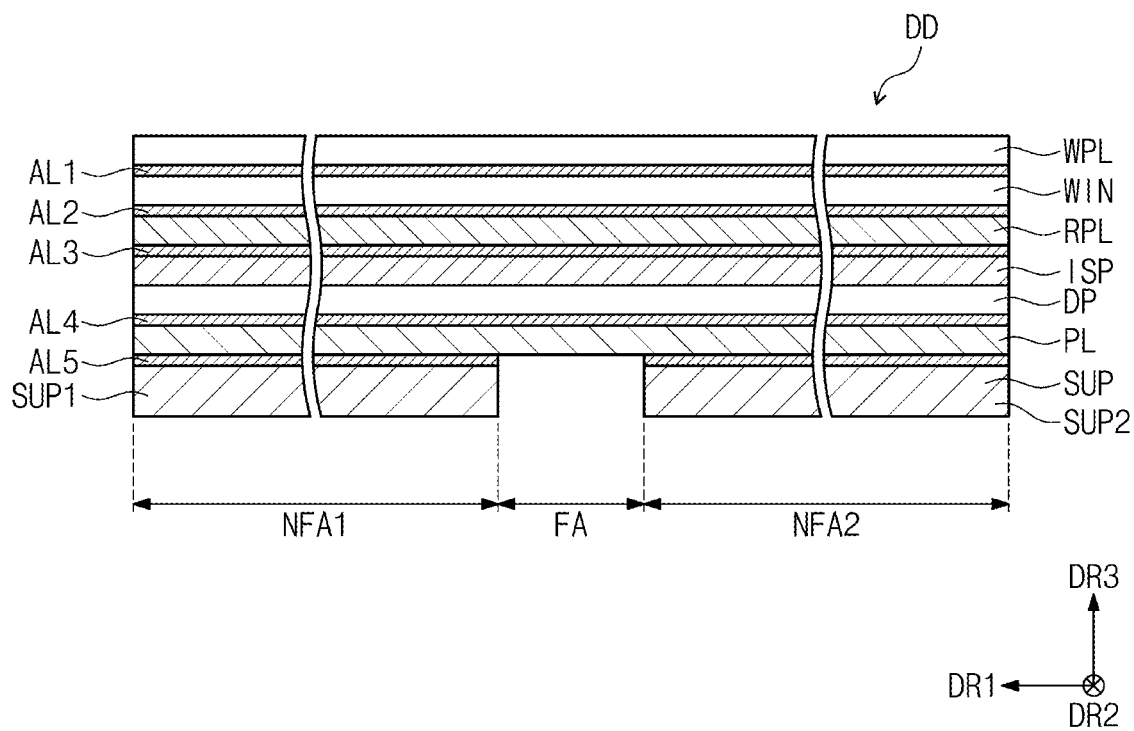
FIG. 5 is a cross-sectional view of the display device of FIG. 1.

FIG. 5 is a cross-sectional view of the display device of FIG. 1.

Referring to FIG. 5, the display device DD may include a display panel DP, an input sensor, which may be in the form of an input sensing part ISP, an anti-reflection layer RPL, a window WIN, a window protection layer WPL, a protection layer PL, a support member, which may be in the form of a support part SUP, and first to fifth adhesive layers AL1 to AL5. The input sensing part ISP, the anti-reflection layer RPL, the window WIN, and the window protection layer WPL may be disposed on the display panel DP, and the protection layer PL and the support part SUP may be disposed below the display panel DP.

The display panel DP may be flexible. For example, the display panel DP may include a plurality of electronic elements disposed on the flexible display panel. The display panel DP may include the first non-folding area NFA1, a second non-folding area NFA2, and the folding area FA disposed between the first non-folding area NFA1 and the second non-folding area NFA2.

The display panel DP according to an exemplary embodiment may be a light emitting type display panel. However, the exemplary embodiments are not limited thereto. For example, the display panel DP may be an organic light emitting display panel, a quantum dot light emitting display panel, or other types of display panels. The organic light emitting display panel may include a light emitting layer containing an organic light emitting material. The quantum dot light emitting display panel may include a light emitting layer containing a quantum dot or a quantum rod. Hereinafter, the display panel DP will be described as the organic light emitting display panel for descriptive convenience.

The input sensing part ISP may be disposed on the display panel DP. The input sensing part ISP may include a plurality of sensors to detect an external input. The sensors may detect the external input by a capacitive method. The input sensing part ISP may be directly manufactured on the display panel DP when the display panel DP is manufactured. However, the exemplary embodiments are not limited thereto. The input sensing part ISP may be manufactured as a panel separated from the display panel DP and then attached to the display panel DP by an adhesive layer.

The anti-reflection layer RPL may be disposed between the input sensing part ISP and the window WIN. The anti-reflection layer RPL may be defined as an external light reflection preventing film. The anti-reflection layer RPL may reduce a reflectance of external light incident toward the display panel DP from above the display device DD. For example, the anti-reflection layer RPL may include a retarder and/or a polarizer.

The window WIN is disposed on the anti-reflection layer RPL. The window WIN may protect the display panel DP, the input sensing part ISP, and the anti-reflection layer RPL from external scratches and impacts. The window WIN may have an optically transparent property.

The window protection layer WPL may be disposed on the window WIN. The window protection layer WPL may protect the window WIN. The window protection layer WPL may have an optically transparent property. Thus, an image generated in the display panel DP may pass through the window WIN and the window protection layer WPL and be provided to a user. The protection layer PL may be disposed below the display panel DP. The protection layer PL may be defined as a protective substrate. The protection layer PL may protect a lower portion of the display panel DP. The protection layer PL may contain a plastic material. For example, the protection layer PL may contain a polyethylene terephthalate (PET).

The support part SUP may be disposed below the protection layer PL. The support part SUP may support the display panel DP. The support part SUP may include a first support part SUP1 overlapping the first non-folding area NFA1 and a second support part SUP2 overlapping the second non-folding area NFA2. The first support part SUP1 may support the first non-folding area NFA1, and the second support part SUP2 may support the second non-folding area NFA2.

Each of the first support part SUP1 and the second support part SUP2 may contain metal. For example, each of the first support part SUP1 and the second support part SUP2 may contain a stainless steel, aluminum, or an alloy thereof. Each of the first support part SUP1 and the second support part SUP2 may have a strength greater than that of the display panel DP.

A cushion layer may be disposed between the protection layer PL and the support part SUP. The cushion layer may absorb an external impact applied to a lower portion of the display device DD to protect the display panel DP. The cushion layer may include a foam sheet having a predetermined elastic force.

A first adhesive layer AL1 may be disposed between the window protection layer WPL and the window WIN. The window protection layer WPL and the window WIN may be attached to each other by the first adhesive layer AL1.

A second adhesive layer AL2 may be disposed between the window WIN and the anti-reflection layer RPL. The window WIN and the anti-reflection layer RPL may be attached to each other by the second adhesive layer AL2. A third adhesive layer AL3 may be disposed between the anti-reflection layer RPL and the input sensing part ISP. The anti-reflection layer RPL and the input sensing part ISP may be attached to each other by the third adhesive layer AL3.

A fourth adhesive layer AL4 may be disposed between the display panel DP and the protection layer PL. The display panel DP and the protection layer PL may be attached to each other by the fourth adhesive layer AL4.

A fifth adhesive layer AL5 may be disposed between the protection layer PL and the support part SUP. The protection layer PL and the support part SUP may be attached to each other by the fifth adhesive layer AL5. Although each of the first to fifth adhesive layers AL1 to AL5 may include, e.g., a pressure sensitive adhesive, the exemplary embodiments are not limited thereto. For example, each of the first to fifth adhesive layers AL1 to AL5 may include various adhesives. Each of the first to fifth adhesive layers AL1 to AL5 may include a silicon-based resin, an acrylic-based resin, or a urethane-based resin. Each of the first to fifth adhesive layers AL1 to AL5 may include a polymer resin including a silicon-based resin, an acrylic-based resin, or a urethane-based resin. For example, each of the first to fifth adhesive layers AL1 to AL5 may be made of an acrylic-based resin.

Figure 6:
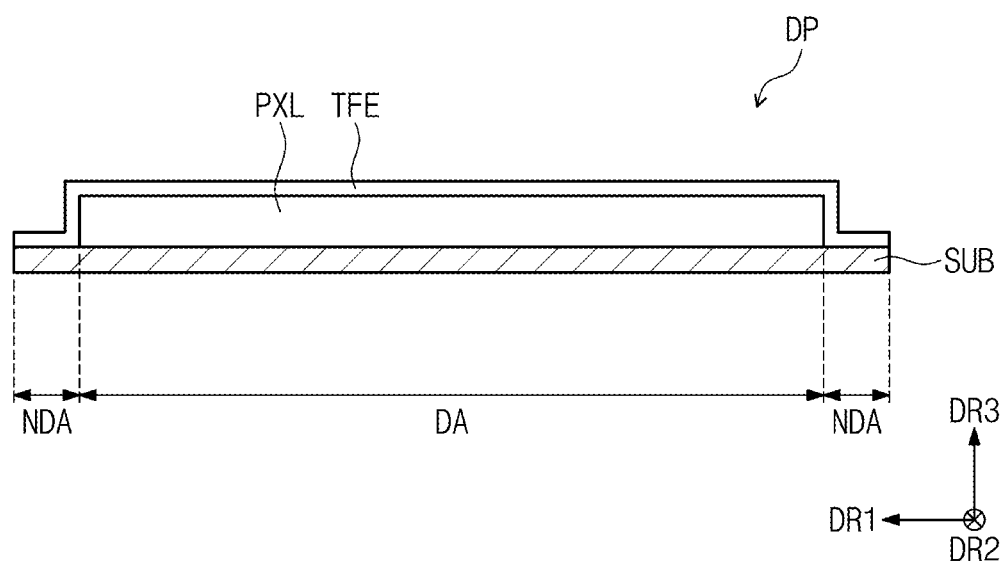
FIG. 6 is a cross-sectional view illustrating the display panel of FIG. 5.

FIG. 6 is a cross-sectional view illustrating the display panel of FIG. 5.

Referring to FIG. 6, the display panel DP may include a substrate SUB, a pixel layer PXL disposed on the substrate SUB, and a thin-film encapsulation layer TFE disposed on the substrate SUB to cover the pixel layer PXL.

The substrate SUB may include the display area DA and the non-display area NDA around the display area DA. The substrate SUB may contain a flexible plastic material. For example, the substrate SUB may contain a polyimide (PI). The pixel layer PXL may include a plurality of pixels. A configuration of each of the pixels will be described below in detail.

The thin-film encapsulation layer TFE may include at least two inorganic layers and an organic layer disposed between the inorganic layers. The inorganic layers may contain an inorganic material and protect the pixel layer PXL from moisture and oxygen. The organic layer may contain an organic material and protect the pixel layer PXL from foreign substances such as dust particles. The above-described input sensing part ISP may be disposed on the thin-film encapsulation layer TFE.

Figure 7:
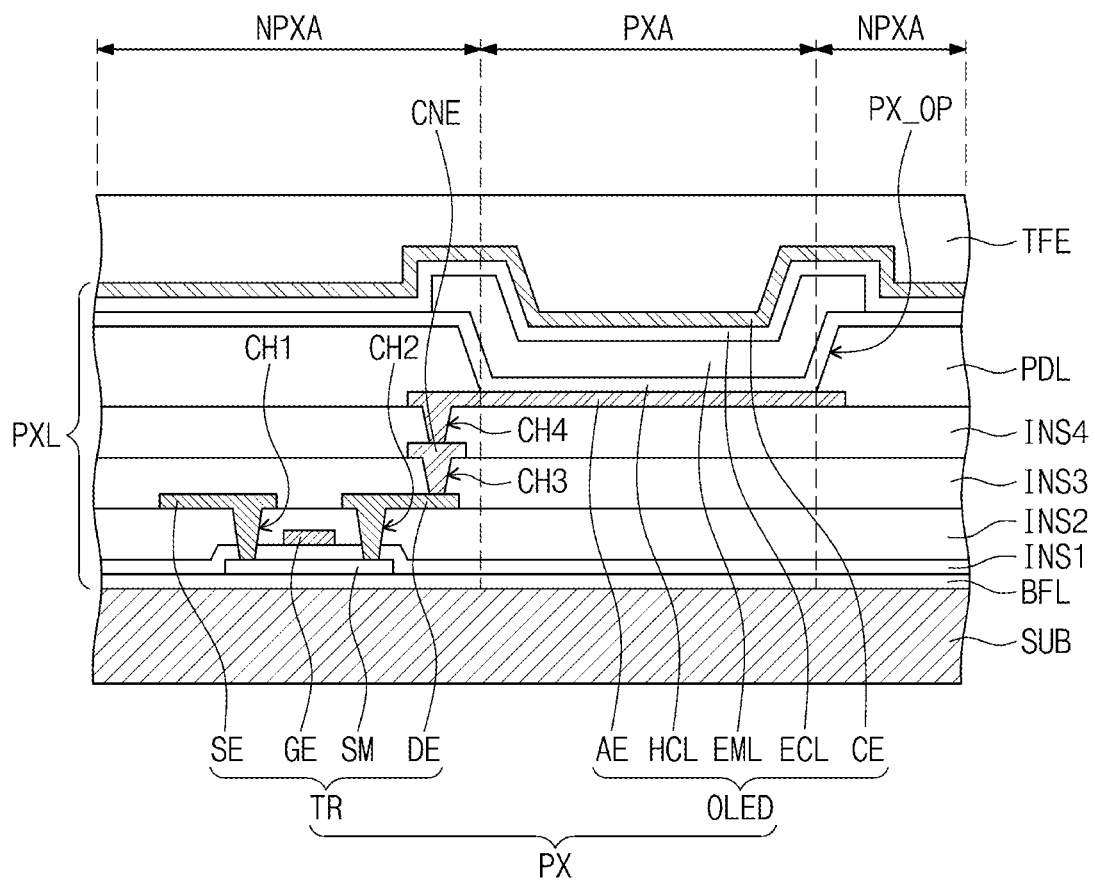
FIG. 7 is a schematic cross-sectional view illustrating a representative pixel disposed in the pixel layer of FIG. 6.

FIG. 7 is a schematic cross-sectional view illustrating a representative pixel disposed in the pixel layer of FIG. 6.

Referring to FIGS. 6 and 7, a pixel PX in FIG. 7 may be provided in plurality in the pixel layer PXL. The representative pixel PX may include a light emitting element OLED and a transistor TR connected to the light emitting element OLED.

The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode. The light emitting element OLED may be defined as an organic light emitting element.

The transistor TR and the light emitting element OLED may be disposed on the substrate SUB. The substrate SUB may include a light emitting area PXA corresponding to each of the pixels PX and a non-light emitting area NPXA disposed around the light emitting area PXA. The light emitting element OLED may be disposed on the light emitting area PXA, and the transistor TR may be disposed on the non-light emitting area NPXA.

A buffer layer BFL may be disposed on the substrate SUB. The buffer layer BFL may contain an inorganic material. A semiconductor layer SM of the transistor TR may be disposed on the buffer layer BFL. The semiconductor layer SM may include a semiconductor made of an inorganic material such as an amorphous silicon or a poly-silicon and an organic semiconductor. Also, the semiconductor layer SM may include an oxide semiconductor.

The semiconductor layer SM may include a source region, a drain region, and a channel region disposed between the source region and the drain region.

A first insulation layer INS1 may be disposed on the buffer layer BFL to cover the semiconductor layer SM. The first insulation layer INS1 may contain an inorganic material. A gate electrode GE of the transistor TR, which overlaps the semiconductor layer SM, may be disposed on the first insulation layer INS1. The gate electrode GE may be disposed to overlap the channel region of the semiconductor layer SM.

A second insulation layer INS2 may be disposed on the first insulation layer INS1 to cover the gate electrode GE. The second insulation layer INS2 may contain an organic material and/or an inorganic material.

A source electrode SE and a drain electrode DE of the transistor TR may be spaced apart from each other on the second insulation layer INS2. The source electrode SE may be connected to the source region of the semiconductor layer SM through a first contact hole CH1 passing through the first and second insulation layers INS1 and INS2. The drain electrode DE may be connected to the drain region of the semiconductor layer SM through a second contact hole CH2 passing through the first and second insulation layers INS1 and INS2.

A third insulation layer INS3 may be disposed on the second insulation layer INS2 to cover the source electrode SE and the drain electrode DE of the transistor TR. The third insulation layer INS3 may contain an organic material. A connection electrode CNE may be disposed on the third insulation layer INS3. The connection electrode CNE may be connected to the drain electrode DE through a third contact hole CH3 defined in the third insulation layer INS3.

A fourth insulation layer INS4 may be disposed on the third insulation layer INS3 to cover the connection electrode CNE. The first electrode AE may be disposed on the fourth insulation layer INS4. The first electrode AE may be connected to the connection electrode CNE through the fourth contact hole CH4 defined in the fourth insulation layer INS4.

A pixel defining layer PDL to expose a predetermined portion of the first electrode AE may be disposed on the first electrode AE and the fourth insulation layer INS4. An opening PX-OP to expose a predetermined portion of the first electrode AE may be defined in the pixel defining layer PXL.

The hole control layer HCL may be disposed on the first electrode AE and the pixel defining layer PDL. The hole control layer HCL may be disposed in common on the light emitting area PXA and the non-light emitting area NPXA. The hole control layer HCL may include a hole transporting layer and a hole injection layer.

The light emitting layer EML may be disposed on the hole control layer HCL. The light emitting layer EML may be disposed in an area corresponding to the opening PX_OP. That is, the light emitting layer EML may be separately provided in each of the pixels PX. The light emitting layer EML may contain an organic material and/or an inorganic material. Although the light emitting layer EML may generate one of red light, green light, and blue light, the exemplary embodiments are not limited thereto. For example, the light emitting layer EML may generate white light through combination of organic materials each generating red light, green light, and blue light.

The electron control layer ECL may be disposed on the light emitting layer EML. The electron control layer ECL may be disposed on the hole control layer HCL to cover the light emitting layer EML. That is, the electron control layer ECL may be disposed in common on the light emitting area PXA and the non-light emitting area NPXA. The electron control layer ECL may include an electron transporting layer and further include an electron injection layer.

The second electrode CE may be disposed on the substrate SUB. The second electrode CE may be disposed in common on the pixels PX. The thin-film encapsulation layer TFE may be disposed on the second electrode CE. A layer disposed between the substrate SUB and the thin-film encapsulation layer TFE may be defined as the pixel layer PXL.

A first voltage may be applied to the first electrode AE, and a second voltage having a level less than the first voltage may be applied to the second electrode CE. In this case, a hole and an electron, which are injected into the light emitting layer EML, may be coupled to each other to provide an exciton, and, while the exciton is transferred to a ground state, the light emitting element OLED may emit light. The light emitting element OLED may emit light to display an image.

Figure 8:
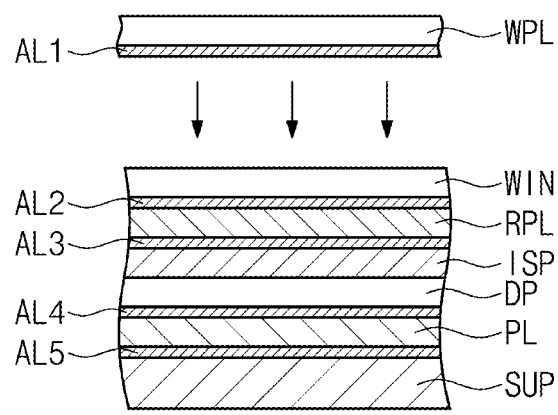
FIG. 8 is a cross-sectional view of an exemplary method to attach a window protection layer to a window of FIG. 5 according to principles of the invention.
Figure 9:
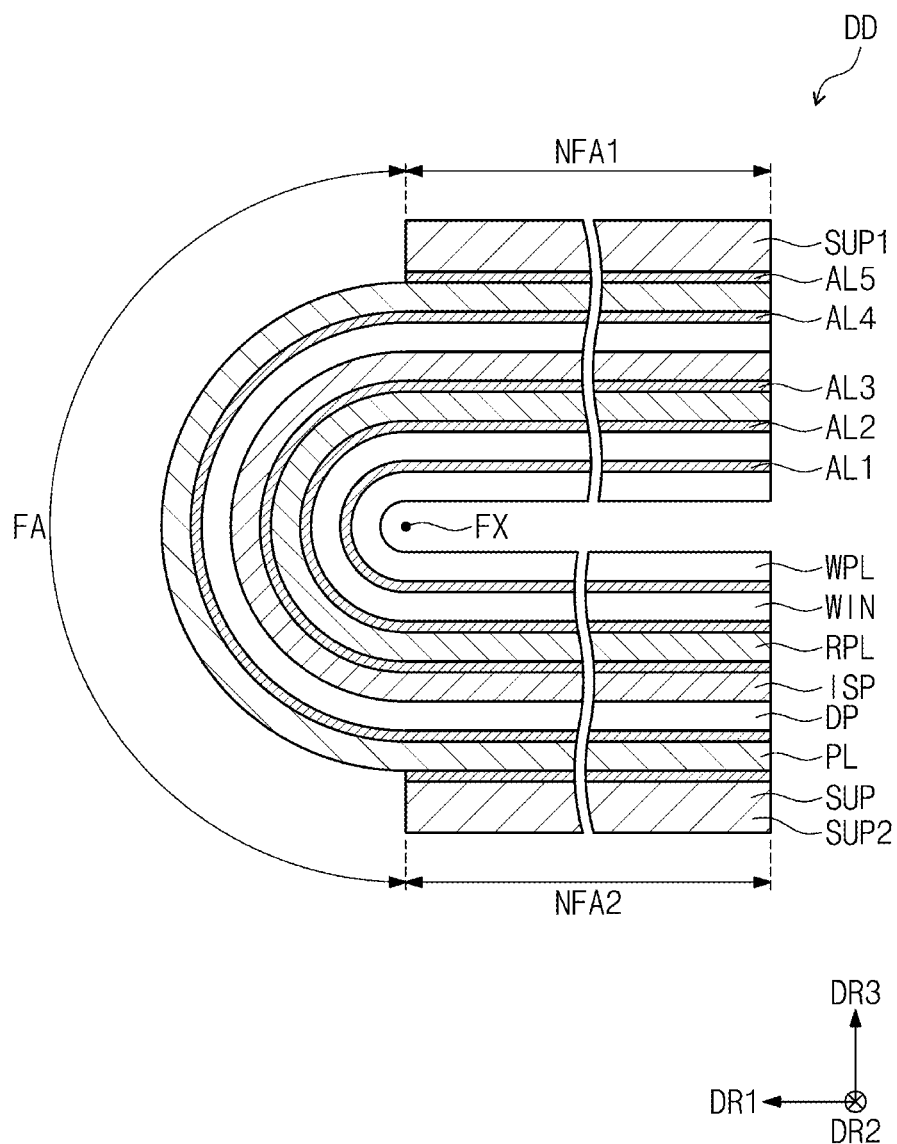
FIG. 9 is a cross-sectional view illustrating an in-folded position of the display device of FIG. 5.

FIG. 8 is a cross-sectional view of an exemplary method to attach a window protection layer to a window of FIG. 5 according to principles of the invention. FIG. 9 is a cross-sectional view illustrating an in-folded position of the display device of FIG. 5.

Referring to FIGS. 5 and 8, the window WIN, the anti-reflection layer RPL, the input sensing part ISP, the display panel DP, the protection layer PL, and the support part SUP may be attached to each other by the second to fifth adhesive layers AL2 to AL5. The window protection layer WPL and the first adhesive layer AL1 may be disposed on the window WIN. The first adhesive layer AL1 may be attached to a bottom surface of the window protection layer WPL, which faces the window WIN. The first adhesive layer AL1 may have a thickness of about 10 µm to about 50 µm.

The window WM may contain a glass. The window protection layer WPL may be a polymer film including at least one polymer resin of a polyethylene terephthalate (PET), a polybutylene terephthalate (PBT), a polyethylene naphthalene (PEN), a polycarbonate (PC), a polymethylmethacrylate (PMMA), a polystyrene (PS), a polyvinylchloride (PVC), a polyethersulfone (PES), a polypropylene (PP), a polyamide (PA), a modified polyphenylene ether (m-PPO), a polyoxymethylene (POM), a polysulfone (PSU), a polyphenylene sulfide (PPS), a polyimide (PI), a polyethyleneimine (PEI), a polyether ether ketone (PEEK), a polyamide imide (PAI), a polyarylate (PAR), and a thermoplastic polyurethane (TPU).

The first adhesive layer AL1 may be attached to a top surface of the window WIN, which faces the window protection layer WPL. The window protection layer WPL may be pressed downward and attached to the window WIN. This process may be defined as a pressing process.

The first adhesive layer AL1 may have a high elastic property, a low strain, and a high adhesive property. Thus, although the window protection layer WPL is pressed toward the first adhesive layer AL1, the elastic property and the adhesive property of the first adhesive layer AL1 may be maintained, and a deformation of the first adhesive layer AL1 may be reduced.

Although the first adhesive layer AL1 is firstly attached to the window protection layer WPL as an example, the exemplary embodiments are not limited thereto. For example, the first adhesive layer AL1 may be firstly attached to the window WIN, and then the window protection layer WPL may be pressed toward the window WIN.

Experimental data for the first adhesive layer AL1 having a high elastic property, a low strain, and a high adhesive property according to some exemplary embodiments is described in detail in conjunction with a comparative example below.

Although a method to attach the window protection layer WPL to the window WIN by the first adhesive layer AL1 as an example is described, the exemplary embodiments are not limited thereto. For example, the window WIN and the anti-reflection layer RPL, the anti-reflection layer RPL and the input sensing part ISP, the display panel DP and the protection layer PL, and the protection layer PL and the support part SUP may be attached to each other by the second to fifth adhesive layers AL2 to AL5 in the same manner.

Each of the second to fifth adhesive layers AL2 to AL5 may contain the same material as and have the same physical properties as the first adhesive layer AL1. Thus, each of the second to fifth adhesive layers AL2 to AL5 may also have a high elastic property, a low strain, and a high adhesive property like the first adhesive layer AL1.

Referring to FIGS. 5 and 9, the display device DD may be in-folded with respect to the folding axis FX. The display device DD may be deformed from a first position that is flat as in FIG. 5 to a second position that is folded as in FIG. 9, or deformed from the second position to the first position. This folding operation may be repeatedly performed.

Each of an area of the display device DD, which overlaps the first support part SUP1, and an area of the display device DD, which overlaps the second support part SUP2, may maintain a generally flat position. The folding area FA may be bent from the boundary between the first support part SUP1 and the folding area FA to the boundary between the second support part SUP2 and the folding area FA.

However, this is merely an example. The exemplary embodiments are not limited to the bent area. For example, a portion of the display device DD, which is adjacent to the first support part SUP1, and a portion of the display device DD, which is adjacent to the second support part SUP2, may maintain a generally flat position, and the rest portion may be bent, so that the display device DD is folded. For the folding operation of the display device DD, each of the window protection layer WPL, the window WIN, the anti-reflection layer RPL, the input sensing part ISP, the display panel DP, the protection layer PL, and the first to fifth adhesive layers AL1 to AL5 may have a generally flexible property.

When the folding operation is repeatedly performed, stress generated in the folding area FA may affect the first to fifth adhesive layers AL1 to AL5. However, since each of the first to fifth adhesive layers AL1 to AL5 has a high elastic property, a low strain, and a generally high adhesive property, the elastic property and the adhesive property of each of the first to fifth adhesive layers AL1 to AL5 may be maintained, and the strain of each of the first to fifth adhesive layers AL1 to AL5 may be reduced.

Hereinafter, test results of an elastic modulus, a strain, and an adhesive force of the first adhesive layer AL1 according to an exemplary embodiment will be described in tables generated based on various temperatures. Also, test results of an elastic modulus, a strain, and adhesive force of a comparative adhesive layer for comparing with the first adhesive layer AL1 will be described in tables in conjunction with the test results of the first adhesive layer AL1.

As described herein, a storage modulus G' and a loss modulus G" of the adhesive layer corresponds to a value measured by a rheometer (manufactured by TA Instruments Corporation, a subsidiary of Waters Corporation of Milford, Mass.). A specimen for measuring the storage modulus G' is prepared by processing the adhesive layer to have a disc shape having the diameter of about 8 mm and a thickness of about 800 μm. For example, an adhesive layer product for being used in the display device DD may be processed to have the diameter of about 8 mm and a thickness of about 800 μm and used as a test specimen.

However, this is merely an example. The adhesive layer attached to the display device DD may be separated from the display device DD and used as the test specimen. For example, when a predetermined time elapses since a portion of the display device DD, in which the adhesive layer is provided, is inserted into an organic solvent, the adhesive layer may be swelled and expanded by the organic solvent. The expanded adhesive layer may be removed from the display device DD, and then processed and used as the test specimen.

The storage modulus G' and the loss modulus G" may be measured at a temperature increase speed of about 10° C./min in a state in which a frequency of about 1 Hz and an axial force of about 1.0N is applied from the rheometer and the adhesive layer maintains a strain of about 1%.

Hereinafter, exemplary embodiments in the tables are test results of the first adhesive layer AL1 made according to the principles and an exemplary embodiment of the invention, and comparative examples are test results of the comparative adhesive layer. The comparative adhesive layer may be substantially an existing adhesive layer.

Table 1 shows test results of a storage modulus G', a loss modulus G", and a tan delta tan δ of the first adhesive layer AL1 and test results of a storage modulus G', a loss modulus G", and a tan delta tan δ of the comparative adhesive layer under a temperature condition of about −20° C.

The storage modulus G' may represent a degree of elasticity of the adhesive layer, and the loss modulus G" may represent a degree of a fluid property of the adhesive layer. The tan delta tan δ may be defined as a value obtained by dividing loss modulus G" by the storage modulus G'. The temperature of about −20° C. may be defined as a low temperature.

TABLE 1

| Item | | G' (MPa) | G" (MPa) | tan δ |
|---|---|---|---|---|
| Embodiment (−20° C.) | Measurement Times | 0.1463 | 0.1518 | 1.0376 |
| | | 0.1475 | 0.1458 | 0.9885 |
| | | 0.1484 | 0.1561 | 1.0519 |
| | | 0.1720 | 0.1798 | 1.0453 |
| | | 0.1994 | 0.2071 | 1.0386 |
| | | 0.1805 | 0.1844 | 1.0216 |
| Comparative Example (−20° C.) | Measurement Times | 0.0800 | 0.0633 | 0.7913 |
| | | 0.0768 | 0.0592 | 0.7708 |
| | | 0.0854 | 0.0696 | 0.8150 |

Referring to the results of Table 1, the first adhesive layer AL1 may have a storage modulus G' of about 0.1463 MPa to about 0.1994 MPa, a loss modulus G" of about 0.1458 MPa to about 0.2071 MPa, and a tan delta tan δ of about 0.9885 to about 1.0519 at a temperature of about −20° C. The first adhesive layer AL1 may have a storage modulus G' greater than that of the comparative adhesive layer at the temperature of about −20° C.

When the adhesive layer is frozen and solidified at the low temperature, the fluid property of the adhesive layer may disappear. In this case, the adhesive layer may lose its adhesive property and be delaminated from an object attached thereto. For example, when the first adhesive layer AL1 is frozen and solidified, the first adhesive layer AL1 may lose its adhesive property and, in this case, be delaminated from the window WIN and the window protection layer WPL.

The adhesive property of the adhesive layer may be maintained when the adhesive layer is not frozen at the low temperature. For example, at the low temperature, as the loss modulus G" is relatively greater than the storage modulus G', the fluid property of the adhesive layer may increase to further thoroughly maintain its adhesive property. Thus, at the low temperature, as a value of the tan delta tan δ, which is defined as a value obtained by dividing loss modulus G" by the storage modulus G', increases, the adhesive layer may have better adhesive properties.

The first adhesive layer AL1 may have a tan delta tan δ greater than that of the comparative adhesive layer at the temperature of about −20° C. Thus, the first adhesive layer AL1 may have an adhesive property greater than that of the comparative adhesive layer at the temperature of about −20° C.

Table 2 shows test results of a storage modulus G', a loss modulus G", and a tan delta tan δ of the first adhesive layer AL1 and test results of a storage modulus G', a loss modulus G", and a tan delta tan δ of the comparative adhesive layer under a condition of about 2° C. The temperature of about 2° C. may be defined as a low temperature.

TABLE 2

| Item | | G' (MPa) | G" (MPa) | tan δ |
|---|---|---|---|---|
| Embodiment (2° C.) | Measurement times | 0.0523 | 0.0256 | 0.4895 |
| | | 0.0538 | 0.0264 | 0.4907 |
| | | 0.0541 | 0.0267 | 0.4935 |
| | | 0.0563 | 0.0275 | 0.4885 |
| | | 0.0629 | 0.0318 | 0.5056 |
| | | 0.0585 | 0.0288 | 0.4923 |
| | | 0.0490 | 0.0229 | 0.4673 |
| | | 0.0526 | 0.0247 | 0.4696 |
| | | 0.0517 | 0.0242 | 0.4681 |
| Comparative Example (2° C.) | Measurement times | 0.0386 | 0.0162 | 0.4197 |
| | | 0.0356 | 0.0150 | 0.4213 |
| | | 0.0395 | 0.0169 | 0.4278 |

Referring to the results of Table 2, the first adhesive layer AL1 may have a storage modulus G' of about 0.0490 MPa to about 0.0629 MPa, a loss modulus G" of about 0.0229 MPa to about 0.0318 MPa, and a tan delta tan δ of about 0.4673 to about 0.5056 at a temperature of about 2° C. The first adhesive layer AL1 may have a storage modulus G' greater than that of the comparative adhesive layer at the temperature of about 2° C. The first adhesive layer AL1 may have a tan delta tan δ greater than that of the comparative adhesive layer at the temperature of about 2° C.

Table 3 shows test results of a storage modulus G', a loss modulus G", and a tan delta tan δ of the first adhesive layer AL1 and test results of a storage modulus G', a loss modulus G", and a tan delta tan δ of the comparative adhesive layer under a temperature condition of about 25° C. The temperature of about 25° C. may be defined as a room temperature.

TABLE 3

| Item | | G' (MPa) | G" (MPa) | tan δ |
|---|---|---|---|---|
| Embodiment (25° C.) | Measurement times | 0.0342 | 0.0119 | 0.3480 |
| | | 0.0348 | 0.0120 | 0.3448 |
| | | 0.0347 | 0.0119 | 0.3445 |
| | | 0.0317 | 0.0108 | 0.3418 |
| | | 0.0345 | 0.0116 | 0.3359 |
| | | 0.0320 | 0.0108 | 0.3397 |
| | | 0.0322 | 0.0108 | 0.3380 |
| | | 0.0341 | 0.0115 | 0.3377 |
| | | 0.0338 | 0.0114 | 0.3395 |
| Comparative Example (25° C.) | Measurement times | 0.0253 | 0.0102 | 0.4043 |
| | | 0.0241 | 0.0097 | 0.4032 |
| | | 0.0258 | 0.0103 | 0.4013 |

Referring to the results of table 3, the first adhesive layer AL1 may have the storage modulus G' of about 0.0317 MPa to about 0.0348 MPa, the loss modulus G" of about 0.0108 MPa to about 0.0120 MPa, and the tan delta tan δ of about 0.3359 to about 0.3503 at a temperature of about 25° C. The first adhesive layer AL1 may have the storage modulus G' greater than that of the comparative adhesive layer at the temperature of about 25° C.

As a temperature increases to a high temperature, the elastic modulus of the adhesive layer may be reduced. Increase in elastic modulus of the adhesive layer is important at a room temperature and a high temperature. For example, at the room temperature and the high temperature, as the storage modulus G' is relatively greater than the loss modulus G", the elastic property of the adhesive layer may be further thoroughly maintained. Thus, at the room temperature and the high temperature, as a value of the tan delta tan δ, which is defined as a value obtained by dividing loss modulus G" by the storage modulus G', decreases, the adhesive layer may have the better elastic property.

The first adhesive layer AL1 may have the tan delta tan δ less than that of the comparative adhesive layer at the temperature of about 25° C. Thus, the first adhesive layer AL1 may have the elastic property greater than that of the comparative adhesive layer at the temperature of about 25° C.

Table 4 shows test results of a storage modulus G', a loss modulus G", and a tan delta tan δ of the first adhesive layer AL1 and test results of a storage modulus G', a loss modulus G", and a tan delta tan δ of the comparative adhesive layer under a condition of about 60° C. The temperature of 60° C. may be defined as a high temperature.

TABLE 4

| Item | | G' (MPa) | G" (MPa) | tan δ |
|---|---|---|---|---|
| Embodiment (60° C.) | Measurement times | 0.0243 | 0.0101 | 0.4172 |
| | | 0.0241 | 0.0102 | 0.4236 |
| | | 0.0241 | 0.0100 | 0.4144 |
| | | 0.0181 | 0.0078 | 0.4137 |
| | | 0.0186 | 0.0076 | 0.4116 |
| | | 0.0181 | 0.0073 | 0.4033 |
| | | 0.0216 | 0.0088 | 0.4081 |
| | | 0.0221 | 0.0090 | 0.4089 |
| | | 0.0219 | 0.0089 | 0.4084 |
| Comparative Example (60° C.) | Measurement times | 0.0175 | 0.0084 | 0.4826 |
| | | 0.0170 | 0.0081 | 0.4811 |
| | | 0.0176 | 0.0084 | 0.4791 |

Referring to the results of table 4, the first adhesive layer AL1 may have a storage modulus G' of about 0.0181 MPa to about 0.0243 MPa, a loss modulus G" of about 0.0073 MPa to about 0.0102 MPa, and a tan delta tan δ of about 0.4064 to about 0.4309 at a temperature of about 60° C. The first adhesive layer AL1 may have a storage modulus G' greater than that of the comparative adhesive layer at a temperature of about 60° C.

The first adhesive layer AL1 may have a tangent delta tan δ less than that of the comparative adhesive layer at the temperature of about 60° C. Thus, the first adhesive layer AL1 may have an elastic property greater than that of the comparative adhesive layer at a temperature of about 60° C.

Table 5 depicts test results of a storage modulus G', a loss modulus G", and a tangent delta tan δ of the first adhesive layer AL1 and test results of a storage modulus G', a loss modulus G", and a tangent delta tan δ of the comparative adhesive layer under a condition of about 85° C. The temperature of about 85° C. may be defined as a high temperature.

TABLE 5

| Item | | G' (MPa) | G" (MPa) | tan δ |
|---|---|---|---|---|
| Embodiment (85° C.) | Measurement times | 0.0215 | 0.0095 | 0.4419 |
| | | 0.0211 | 0.0094 | 0.4455 |
| | | 0.0211 | 0.0093 | 0.4408 |
| | | 0.0139 | 0.0058 | 0.4173 |
| | | 0.0140 | 0.0060 | 0.4286 |
| | | 0.0137 | 0.0058 | 0.4234 |
| Comparative Example (85° C.) | Measurement times | 0.0165 | 0.0080 | 0.4848 |
| | | 0.0158 | 0.0078 | 0.4937 |
| | | 0.0159 | 0.0077 | 0.4843 |

Referring to the results of Table 5, the first adhesive layer AL1 may have a storage modulus G' of about 0.0137 MPa to about 0.0215 MPa, a loss modulus G" of about 0.0058 MPa to about 0.0095 MPa, and a tan delta tan δ of about 0.4173 to about 0.4455 at a temperature of about 85° C.

The first adhesive layer AL1 may have a tan delta tan δ less than that of the comparative adhesive layer at a temperature of about 85° C. Thus, the first adhesive layer AL1 may have an elastic property greater than that of the comparative adhesive layer at the high temperature of about 85° C.

Thus, the first adhesive layer AL1 may have the higher elastic property and the higher adhesive property than those of the comparative adhesive layer. In the tests of Tables 1 to 5, a glass transition temperature of the first adhesive layer AL1 is measured in a range from about −37.41° C. to about 37.86° C.

As described herein, a creep value and a residual strain of the adhesive layer corresponds to a value measured by a rheometer, as described above. A specimen for measuring the creep value and the residual strain is prepared by forming the adhesive layer into a disc shape having a diameter of about 8 mm and a thickness of about 800 μm.

The creep value is measured as a strain of the adhesive layer when a stress of about 2,000 Pa is applied to the adhesive layer for about 10 minutes. The residual strain is measured as the strain of the adhesive layer when about 10 minutes elapse after the applied stress is removed. The residual strain may be defined as the strain of the adhesive layer remaining after the stress is removed and the adhesive layer is restored for about 10 minutes. As each of the creep value and the residual strain decreases, the strain of the adhesive layer according to stress or pressure may decrease.

Table 6 shows test results of a creep value and a residual strain of the first adhesive layer AL1 and test results of a creep value and a residual strain of the comparative adhesive layer under a temperature condition of about 60° C.

TABLE 6

| Item | | | Creep (%) | Residual strain (%) |
|---|---|---|---|---|
| Embodiment (60° C.) | Measurement Times | 1 | 54.6489 | 7.1522 |
| | | 2 | 52.3894 | 6.3912 |
| | | 3 | 59.9129 | 8.5546 |
| Comparative Example (60° C.) | Measurement Times | 1 | 82.3432 | 9.7029 |
| | | 2 | 92.2501 | 12.5500 |
| | | 3 | 88.9345 | 12.1736 |

Referring to results of Table 6, the first adhesive layer AL1 may have a creep value of about 52.3894% to about 59.9129% when a stress of about 2,000 Pa is maintained for about 10 minutes at the temperature of about 60° C. Also, the first adhesive layer AL1 may have a residual strain of about 6.3912% to about 8.5546% when about 10 minutes elapse after the applied stress is removed at a temperature of about 60° C.

The first adhesive layer AL1 may have the creep value and the residual strain less than those of the comparative adhesive layer at a temperature of about 60° C. The first adhesive layer AL1 has a recovery rate of about 85.7216% to about 87.8005% according to the creep value and the residual strain thereof at the temperature of about 60° C.

Table 7 shows test results of a creep value and a residual strain of the first adhesive layer AL1 and test results of a creep value and a residual strain of the comparative adhesive layer under a temperature condition of about 25° C.

TABLE 7

| Item | | | Creep (%) | Residual strain (%) |
|---|---|---|---|---|
| Embodiment (25° C.) | Measurement times | 1 | 40.4371 | 8.0211 |
| | | 2 | 39.5930 | 7.6818 |
| | | 3 | 40.2377 | 7.8832 |
| | | 4 | 39.2202 | 7.9451 |
| | | 5 | 38.1876 | 7.1680 |
| | | 6 | 38.3271 | 7.0426 |
| Comparative Example (25° C.) | Measurement times | 1 | 80.2405 | 18.4382 |
| | | 2 | 72.3271 | 14.5583 |
| | | 3 | 68.7543 | 12.8406 |

Referring to results of Table 7, the first adhesive layer AL1 may have a creep value of about 38.1876% to about 40.4371% when a stress of about 2,000 Pa is maintained for about 10 minutes at the temperature of about 25° C. Also, the first adhesive layer AL1 may have a residual strain of about 7.0426% to about 8.0211% when about 10 minutes elapse after the applied stress is removed at the temperature of about 25° C.

The first adhesive layer AL1 may have a creep value and residual strain less than those of the comparative adhesive layer at a temperature of about 25° C. The first adhesive layer AL1 has a recovery rate of about 79.7425% to about 81.6250% according to the creep value and the residual strain thereof at the temperature of about 25° C.

Since the first adhesive layer AL1 has a creep value and a residual strain less than those of the comparative adhesive layer, the strain of the first adhesive layer AL1 according to stress or pressure may decrease further than the comparative adhesive layer.

Figure 10:
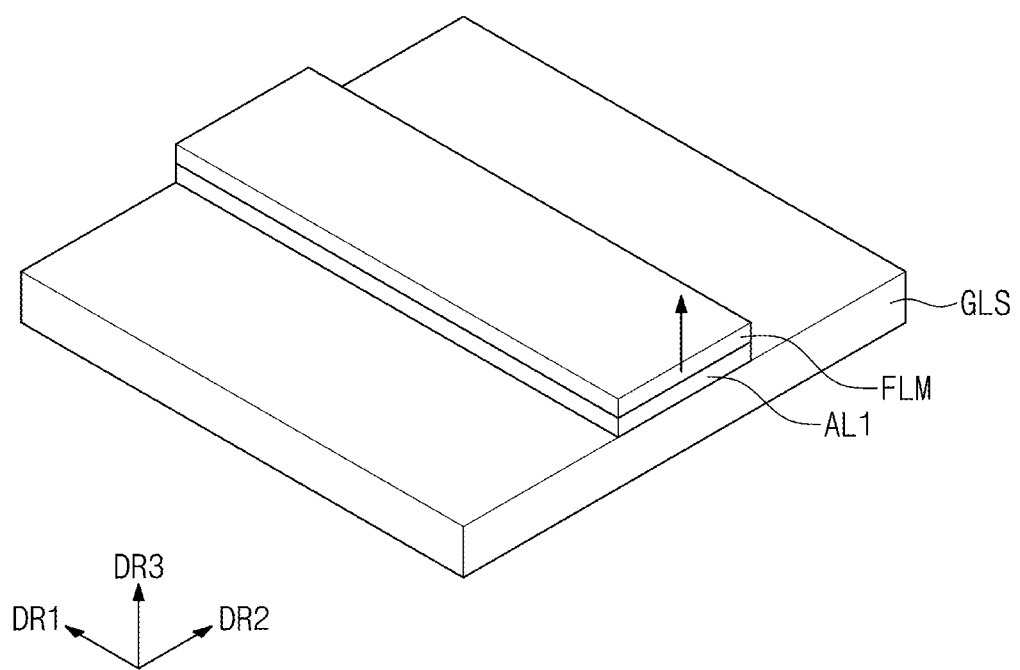
FIG. 10 is a perspective view of a method for measuring an adhesive force of the first adhesive layer of FIG. 5.

FIG. 10 is a perspective view of a method for measuring an adhesive force of the first adhesive layer of FIG. 5.

Referring to FIG. 10, a glass GLS may be prepared as a base layer, and the first adhesive layer AL1 may be disposed on the glass GLS. A film FLM may be disposed on the first adhesive layer AL1. The film FLM may be attached to the glass GLS by the first adhesive layer AL1. The glass GLS may correspond to the window WIN, and the film FLM may correspond to the window protection layer WPL.

The adhesive force of the first adhesive layer AL1 is measured when the film FLM is attached to the glass GLS for about 30 minutes, and the film FLM is delaminated from the glass GLS after about 30 minutes. The adhesive force of the comparative adhesive layer is measured in the same manner.

Table. 8 shows test results of the adhesive force of the first adhesive layer AL1 and the adhesive force of the comparative adhesive layer under temperature conditions of about 25° C. and about 80° C.

TABLE 8

| | Adhesive force | |
|---|---|---|
| Item | 25° C. | 80° C. |
| Embodiment | 810 ± 25 gf/in | 256 ± 17 gf/in |
| Comparative example | 490 ± 9 gf/in | 210 ± 13 gf/in |

Referring to the results of Table 8, the adhesive force of the first adhesive layer AL1 with respect to the glass GLS (e.g., the window WIN) at the temperature of about 25° C. may be about 810±25 gf/in. At the temperature of about 80° C., the adhesive force of the first adhesive layer AL1 with respect to the glass GLS may be about 256±17 gf/in. The first adhesive layer AL1 may have an adhesive force greater than that of the comparative adhesive layer. Thus, the first adhesive layer AL1 may have a high adhesive property.

Figure 11:
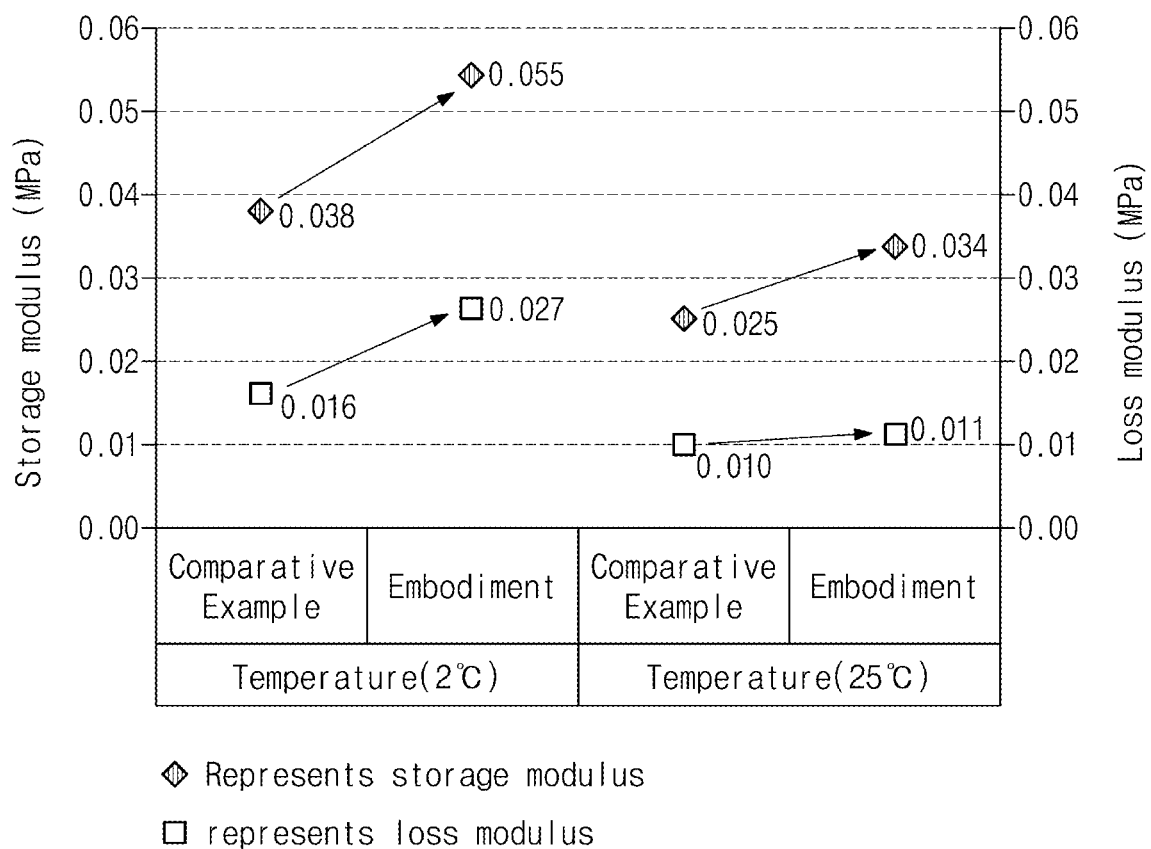
FIG. 11 is a graphical depiction of mean values of a storage modulus and a loss modulus of the first adhesive layer made according to the principles of the invention and mean values of a storage modulus and a loss modulus of a comparative adhesive layer at temperatures of about 2° C. and about 25° C.
Figure 12:
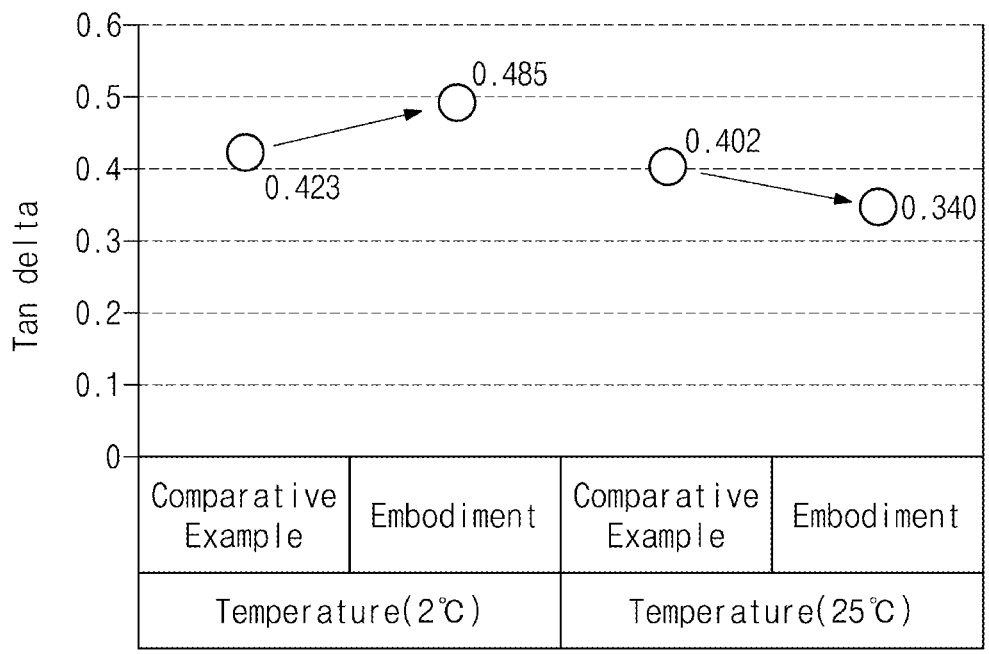
FIG. 12 is a graphical depiction of mean values of tan delta of the first adhesive layer made according to the principles of the invention and mean values of a tan delta of the comparative adhesive layer at temperatures of about 2° C. and about 25° C.
Figure 13:
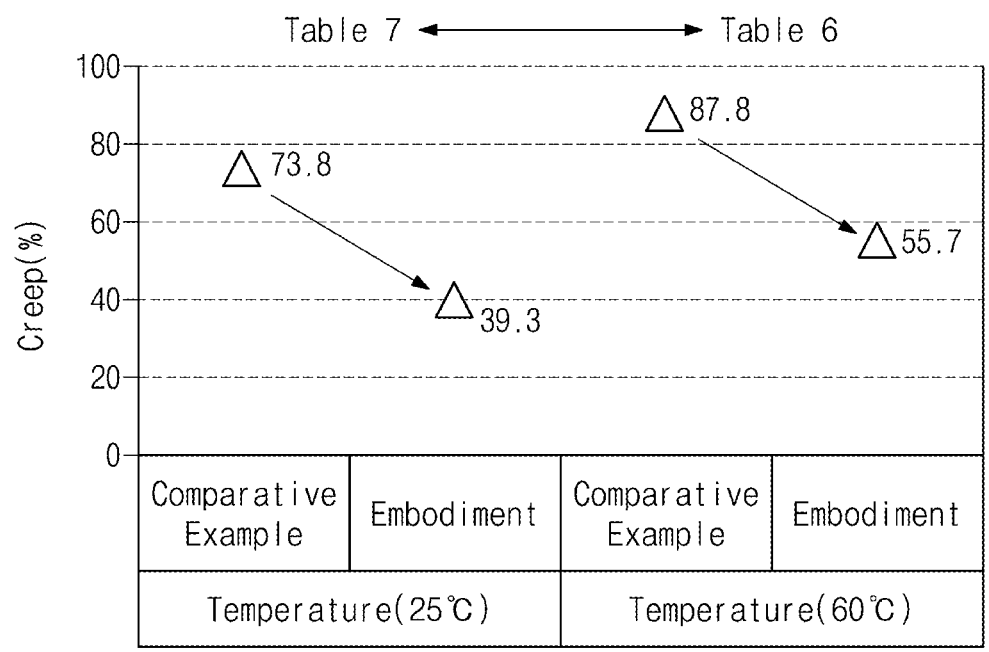
FIG. 13 is a graphical depiction of mean values of a creep value of the first adhesive layer made according to the principles of the invention and mean values of a creep value of the comparative adhesive layer at temperatures of about 25° C. and about 60° C.

FIG. 11 is a graphical depiction of mean values of a storage modulus and a loss modulus of the first adhesive layer made according to the principles of the invention and mean values of a storage modulus and a loss modulus of a comparative adhesive layer at temperatures of about 2° C. and about 25° C. FIG. 12 is a graphical depiction of mean values of tan delta of the first adhesive layer made according to the principles of the invention and mean values of a tan delta of the comparative adhesive layer at temperatures of about 2° C. and about 25° C. FIG. 13 is a graphical depiction of mean values of a creep value of the first adhesive layer made according to the principles of the invention and mean values of a creep value of the comparative adhesive layer at temperatures of about 25° C. and about 60° C.

For example, FIGS. 11 and 12 depict mean values of data in Tables 2 and 3 for respective exemplary and comparative examples. Similarly, FIG. 13 depicts mean values of data in Tables 6 and 7 for respective exemplary and comparative examples. In FIG. 11, each of the storage modulus and the loss modulus is expressed to three decimal places. In FIGS. 12 and 13, for example, the tan delta value is expressed to three decimal places, and the creep value is expressed to one decimal place.

Referring to FIG. 11, the first adhesive layer AL1 may have a storage modulus and a loss modulus greater than those of the comparative adhesive layer at temperatures of about 2° C. and about 25° C. based on the mean values of the storage modulus and the loss modulus.

Referring to FIG. 12, the first adhesive layer AL1 may have a tan delta greater than that of the comparative adhesive layer at the temperature of about 2° C. and a tan delta less than that of the comparative adhesive layer at a temperature of about 25° C. based on the mean values of the tan delta.

Referring to FIG. 13, the first adhesive layer AL1 may have a creep value less than that of the comparative adhesive layer at temperatures of about 25° C. and about 60° C. based on the mean values of the creep value.

According to the above-described significant and unexpected test results, the first adhesive layer AL1 may have a high elastic property, low strain, and high adhesive property. Thus, during the pressing process and the folding operations of the display device DD, the elastic property and the adhesive property of the first adhesive layer AL1 may be easily maintained, and the strain of the first adhesive layer AL1 may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel;
   a window disposed on the display panel;
   a window protection layer disposed on the window; and
   a first adhesive layer disposed between the window and the window protection layer;
   wherein the first adhesive layer has a creep value of about 38.1876% to about 40.4371% at a temperature of about 25° C. when a stress of about 2,000 Pa is applied to the first adhesive layer for about 10 minutes,
   the first adhesive layer has a storage modulus of about 0.0317 MPa to about 0.0348 MPa, a loss modulus of about 0.0108 MPa to about 0.0120 MPa, and a tan delta value of about 0.3354 to about 0.3480 at the temperature of about 25° C. when a frequency of about 1 Hz and an axial force of about 1.0 N are applied and the first adhesive layer maintains a strain of about 1%, and
   the tan delta value is defined by dividing the loss modulus by the storage modulus.

2. The display device of claim 1, wherein the first adhesive layer has a storage modulus of about 0.1463 MPa to about 0.1994 MPa, a loss modulus of about 0.1458 MPa to about 0.2071 MPa, and a tan delta value of about 0.9885 to about 1.0519 at a temperature of about −20° C.

3. The display device of claim 1, wherein the first adhesive layer has a storage modulus of about 0.0490 MPa to about 0.0629 MPa, a loss modulus of about 0.0229 MPa to about 0.0318 MPa, and a tan delta value of about 0.4673 to about 0.5056 at a temperature of about 2° C.

4. The display device of claim 1, wherein the first adhesive layer has a storage modulus of about 0.0181 MPa to about 0.0243 MPa, a loss modulus of about 0.0073 MPa to about 0.0102 MPa, and a tan delta value of about 0.4033 to about 0.4309 at a temperature of about 60° C.

5. The display device of claim 1, wherein the first adhesive layer has a storage modulus of about 0.0137 MPa to about 0.0215 MPa, a loss modulus of about 0.0058 MPa to about 0.0095 MPa, and a tan delta value of about 0.4173 to about 0.4455 at a temperature of about 85° C.

6. The display device of claim 1, wherein the first adhesive layer has a residual strain of about 7.0426% to about 8.0211% at a temperature of about 25° C. when about 10 minutes elapse after the stress applied to the first adhesive layer is removed.

7. The display device of claim 1, wherein the first adhesive layer has a creep value of about 52.3894% to about 59.9129% at a temperature of about 60° C. when stress of about 2,000 Pa is applied to the first adhesive layer for about 10 minutes.

8. The display device of claim 7, wherein the first adhesive layer has a residual strain of about 6.3912% to about 8.5546% at a temperature of about 60° C. when about 10 minutes elapse after the stress applied to the first adhesive layer is removed.

9. The display device of claim 1, wherein the first adhesive layer has a thickness of about 10 µm to about 50 µm.

10. The display device of claim 1, wherein the first adhesive layer comprises a silicon-based resin, an acrylic-based resin, or an urethane-based resin.

11. The display device of claim 1, wherein the window protection layer comprises at least one polymer resin of a polyethylene terephthalate, a polybutylene terephthalate, a polyethylene naphthalene, a polycarbonate, a polymethylmethacrylate, a polystyrene, a polyvinylchloride, a polyethersulfone, a polypropylene, a polyamide, a modified polyphenylene ether, a polyoxymethylene, a polysulfone, a polyphenylene sulfide, a polyimide, a polyethyleneimine, a polyether ether ketone, a polyamide imide, a polyarylate, and a thermoplastic polyurethane.

12. The display device of claim 1, further comprising:
   an input sensor disposed on the display panel;
   an anti-reflection layer disposed between the input sensor and the window;
   a protection layer disposed below the display panel;
   a support member disposed below the protection layer;
   a second adhesive layer disposed between the window and the anti-reflection layer;
   a third adhesive layer disposed between the anti-reflection layer and the input sensor;
   a fourth adhesive layer disposed between the display panel and the protection layer; and
   a fifth adhesive layer disposed between the protection layer and the support member;
   wherein at least one of the second, third, fourth, and fifth adhesive layers has substantially the same physical properties as the first adhesive layer.

13. The display device of claim 1, wherein the window comprises a glass.

14. The display device of claim 13, wherein an adhesive force of the first adhesive layer with respect to the window is about 810±25 gf/in at the temperature of about 25° C., and the adhesive force is a delamination force value when the window protection layer is attached to the window through the first adhesive layer and delaminated from the window after about 30 minutes elapse.

15. The display device of claim 14, wherein an adhesive force of the first adhesive layer with respect to the window is about 256±17 gf/in at the temperature of about 80° C., and the adhesive force is a delamination force value when the window protection layer is attached to the window through the first adhesive layer and delaminated from the window after about 30 minutes elapse.

16. The display device of claim 1, wherein at least one of the display panel and the window protection layer is in-folded or out-folded with respect to a folding axis.

17. A display device comprising:
a display panel;
a window disposed on the display panel;
a window protection layer disposed on the display panel; and
an adhesive layer disposed between the window and the window protection layer;
wherein an adhesive force of the adhesive layer with respect to the window is about 810±25 gf/in at a temperature of about 25° C., and an adhesive force of the adhesive layer with respect to the window is about 256±17 gf/in at a temperature of about 80° C.; and
the adhesive force is a delamination force value when the window protection layer is attached to the window through the adhesive layer and delaminated from the window after about 30 minutes elapse.

18. The display device of claim 17, wherein the adhesive layer has a creep value of about 38.3271% to about 40.4371% at the temperature of about 25° C. when a stress of about 2,000 Pa is applied to the adhesive layer for about 10 minutes, and
the adhesive layer has a storage modulus of about 0.0317 MPa to about 0.0348 MPa and a loss modulus of about 0.0108 MPa to about 0.0120 MPa at the temperature of about 25° C. when a frequency of about 1 Hz and an axial force of about 1.0 N are applied and the adhesive layer maintains a strain of about 1%.

* * * * *